United States Patent
Van Schyndel

(10) Patent No.: US 6,621,338 B1
(45) Date of Patent: Sep. 16, 2003

(54) GAIN DETERMINATION FOR CORRELATION PROCESSES

(75) Inventor: Andre J. Van Schyndel, Kanata (CA)

(73) Assignee: Nortel Networks Limited, St. Laurent (CA)

( * ) Notice: Subject to any disclaimer, the term of this patent is extended or adjusted under 35 U.S.C. 154(b) by 203 days.

(21) Appl. No.: 09/742,232

(22) Filed: Dec. 22, 2000

(51) Int. Cl.[7] ............... H03G 3/20; G06F 7/556; H03K 5/08
(52) U.S. Cl. .................. 330/129; 327/348; 327/309
(58) Field of Search .................. 330/129; 327/348, 327/309

(56) References Cited

U.S. PATENT DOCUMENTS

| | | | |
|---|---|---|---|
| 5,027,117 A | * 6/1991 | Yoshida et al. | 341/132 |
| 5,046,107 A | 9/1991 | Iwamatsu | |
| 5,239,693 A | 8/1993 | Gailus et al. | |
| 5,459,426 A | 10/1995 | Hori | |
| 5,659,313 A | * 8/1997 | Dischert et al. | 341/132 |
| 5,752,171 A | 5/1998 | Akiya | |
| 5,910,751 A | * 6/1999 | Winn et al. | 327/560 |
| 6,047,167 A | 4/2000 | Yamashita | |
| 6,195,029 B1 | * 2/2001 | Urry et al. | 341/138 |
| 6,236,864 B1 | * 5/2001 | McGowan et al. | 455/522 |

* cited by examiner

*Primary Examiner*—Patricia Nguyen

(57) ABSTRACT

A method and apparatus for setting the level of an analog signal supplied to an electronic device having a maximum input level. The method includes computing a gain which, when applied to the analog signal, causes the amplified signal to exceed the maximum input level for a percentage of time which is greater than zero, and applying the gain to the analog signal. When clipping occurs at least part of the time, the correlation result obtained for a pair of truly correlated signals remains virtually unaffected, while there is actually a beneficial effect on the correlation result obtained for a pair of truly uncorrelated signals. To determine the amplifier gain needed to attain the desired amount of clipping, the present invention capitalizes on the availability of power measurements taken from the signal before it was amplified. Reliance on feedback from the amplifier output is not required, resulting in a simplified gain computation process.

21 Claims, 3 Drawing Sheets

GAIN DETERMINATION FOR CORRELATION PROCESSES

FIELD OF THE INVENTION

The present invention relates generally to systems used for computing the correlation between two signals and, more particularly, to methods of setting the gain of amplifiers used in such systems.

BACKGROUND OF THE INVENTION

Digital transmission systems for communication usually include links in which many slower data streams are multiplexed together onto a single higher speed link. This higher speed link may be implemented by an optical transmission system. Such systems can be end-to-end links, or networks of optical links, with switching elements. Testing and verifying the operation of switching elements of such an optical network can pose problems, particularly because the data rates are often very high.

It is known that connectivity through a network can be guaranteed by network layer protocols such as TCP/IP, which can request retransmission if some data does not arrive. At the physical data transfer level, path trace bytes can be inserted and checked to ensure that a frame of data is routed correctly. However, such methods require decoding the data stream, which usually only takes place at a terminal at the end of the path through the optical network.

With a view to performing connection verification in a non-intrusive manner at an intermediate switching element, developments have been made in the field of testing using pattern matching. For example, as disclosed in U.S. Pat. No. 6,005,695 issued to Roberts, assigned to the assignee of the present invention and incorporated by reference herein, pattern matching can be carried out by a correlation process involving the low frequency components of an input signal and a switched signal. Since the connection map being applied by the switching element is known, it is a simple matter to determine the expected result (i.e., low or high) of the correlation process. By performing a comparison of the measured and expected correlation values, one can assess whether the switching element is operating properly or is malfunctioning.

It should therefore be apparent that obtaining a reliable correlation value from the correlation process is essential to making a correct decision as to whether or not the switching element is operating correctly. Since the input signal and the switched signal often have different signal levels, for example due to losses suffered within the switching element, it is important to provide appropriate amplification or attenuation (i.e., "level setting") prior to computing the correlation value. One way of providing level setting relies on a pair of programmable-gain amplifiers, one on the input signal side and another one on the switched signal side. A significant challenge lies in appropriately setting the gains of the two amplifiers such that the ensuing correlation results are reliable.

SUMMARY OF THE INVENTION

It has been found that when clipping occurs at least part of the time, the correlation result obtained for a pair of truly correlated signals remains virtually unaffected, while there is actually a beneficial effect on the correlation result obtained for a pair of truly uncorrelated signals. Accordingly, the present invention provides for each signal to be amplified to such an extent that the amplified version of the signal will be clipped by a subsequent analog-to-digital converter for a desired percentage of the time, on average. A correlation value is then computed in the digital domain based on the clipped signals. To determine the amplifier gain needed to attain the desired amount of clipping, the present invention capitalizes on the availability of power measurements taken from the signal before it was amplified. In this way, reliance on feedback from the amplifier output is not required, thus simplifying the gain computation process.

Accordingly, the invention may be summarized broadly as a method of setting the level of an analog signal supplied to an electronic device having a maximum input level, including computing a gain which, when applied to the analog signal, causes the resulting amplified signal to exceed the maximum input level for a percentage of time which is greater than zero, and applying the gain to the analog signal.

The invention may also be broadly summarized as a combination which includes an electronic device having an input terminal and characterized by a maximum input level, and an amplifier connected to the input terminal of the electronic device, for applying a gain to an analog input signal, the gain being selected such that the percentage of time during which the signal supplied to the electronic device exceeds the maximum input level is greater than zero.

The invention may also be broadly summarized as a method of jointly processing a first signal and a second signal, including applying a first gain to the first signal and applying a second gain to the second signal, thereby to produce first and second amplified signals, respectively; limiting the amplitude of the first amplified signal to within a first fixed range and limiting the amplitude of the second amplified signal to within a second fixed range; digitally correlating the amplitude-limited signals; and controlling the first gain so as to cause the first amplified signal to fall outside the first fixed range during a first percentage of time that is greater than zero and controlling the second gain so as to cause the second amplified signal to fall outside the second fixed range during a second percentage of time that is greater than zero.

The invention may further be broadly summarized as a system for processing a pair of analog signals, including a first unit for applying a gain to each signal; a second unit for limiting the amplitude of each amplified signal to within a maximum range; a third unit for digitally correlating the amplitude-limited signals; and a fourth unit for controlling the gain applied to each signal so as to cause the corresponding amplified signal to fall outside the maximum range during a percentage of the time that is greater than zero.

In addition, the invention may be broadly summarized as a correlation engine, including a first analog-to-digital converter (ADC) having a fixed input range, a first programmable-gain amplifier connected to an input of the first ADC, a second ADC having a fixed input range, a second programmable-gain amplifier connected to an input of the second ADC, a correlator connected to the first and second ADCs, and a control element connected to the first and second amplifiers, for setting the gain of the first and second amplifiers to such a value that the average percentage of time during which the signal amplified by the each amplifier falls outside the input range of the respective ADC is greater than zero.

The invention may also be broadly summarized as computer-readable media tangibly embodying a program of instructions executable by a computer to perform a method of computing a gain of an amplifier used for amplifying an analog signal to be fed to an electronic device having a maximum input level $V_{MAX}$, wherein the analog signal is the result of low-pass filtering an $F_C$-bps bit stream to $F_B$ hertz, the method including continuously reading a mean level $V_{AVG}$ of the analog signal and computing the gain as substantially equal to the quotient of $(V_{MAX} \times V_{AVG} \times (2 F_{LP}))^{1/2}$ and $(\beta \times (R_{CLK})^{1/2})$, where $\beta$ is chosen such that the value of the complementary error function (erfc) at $\beta$ corresponds to a desired probability of clipping.

BRIEF DESCRIPTION OF THE DRAWINGS

These and other aspects and features of the present invention will now become apparent to those of ordinary skill in the art upon review of the following description of specific embodiments of the invention in conjunction with the accompanying drawings, in which.

DETAILED DESCRIPTION OF THE PREFERRED EMBODIMENTS

Figure 1:
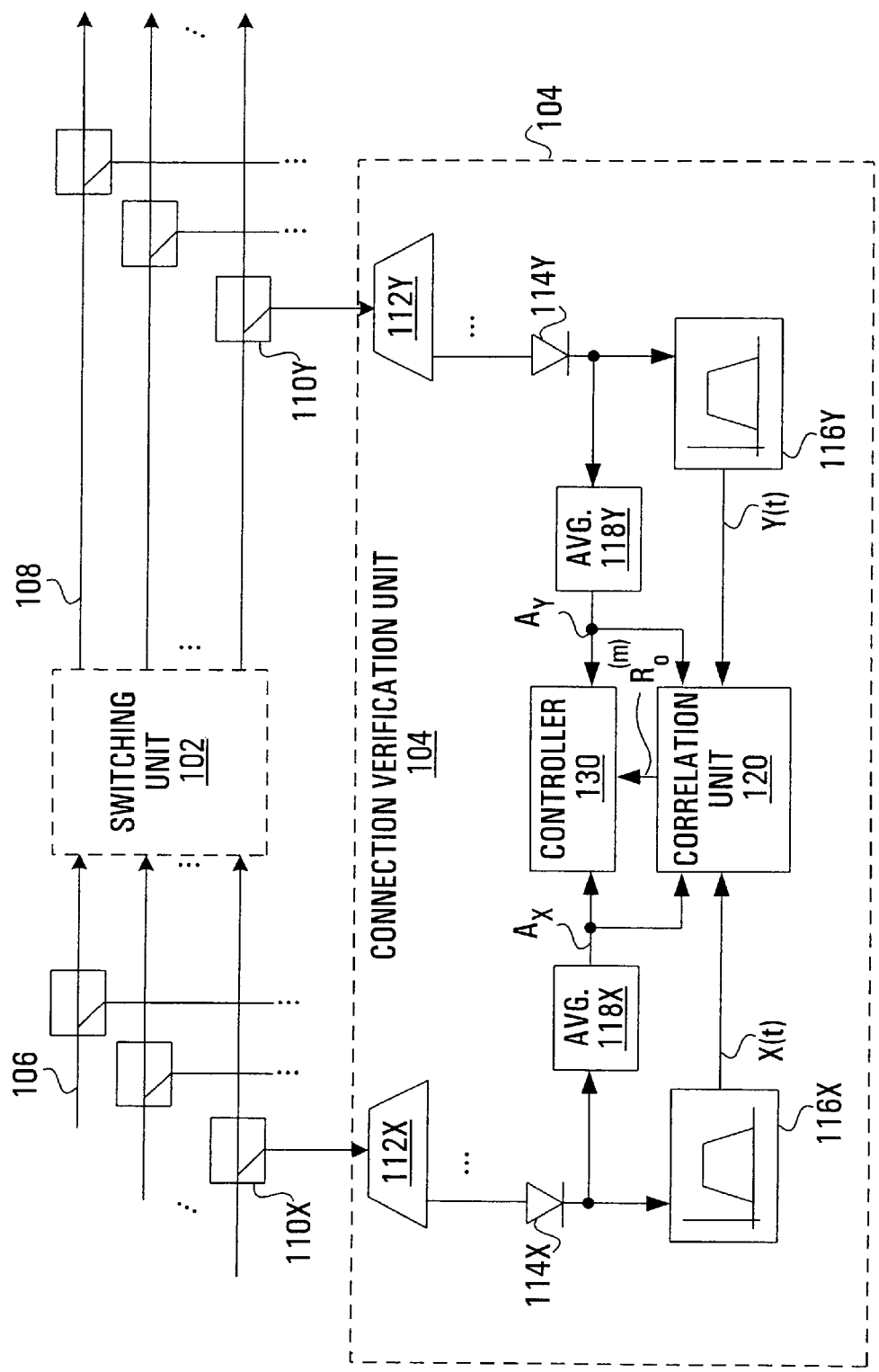
FIG. 1 is a block diagram of an optical switching element that uses correlation processes to verify connections through the switching element.

With reference to FIG. 1, there is shown an optical switching element, comprising a switching unit 102 and a connection verification unit 104. A plurality of input optical fibers 106 carry respective wavelength-division-multiplexed (WDM) input signals to the switching unit 102 and a plurality of output optical fibers 108 carry respective WDM switched signals out of the switching unit 102. The single-wavelength signal occupying a given wavelength could be a high-speed digital optical signal (for example a 10 gigabit-per-second non-return-to-zero optical pulse stream) with a clock rate denoted $F_C$.

The switching unit 102 performs switching of the single-wavelength signals occupying individual wavelengths on each of the input WDM fibers 106. The type of switching performed by the switching unit 102 may preserve the wavelengths of the individual signals being switched. In some embodiments, the switching unit 102 may also allow a change in wavelength to take place, thus permitting any single-wavelength signal on any input optical fiber 106 to appear on any wavelength and on any of the output optical fibers 108. An example of a suitable switching unit 102 is described in U.S. patent application Ser. #09/511,065 to Graves et al., entitled "Switch for Optical Signals", filed on Feb. 23, 2000, assigned to the assignee of the present invention and incorporated by reference herein.

An optical tap splitter 110X is connected in the path of each input optical fiber 106 and allows a portion of the respective WDM input signal to be fed to the connection verification unit 104. Similarly, an optical tap splitter 110Y is connected in the path of each output optical fiber 108 and allows a portion of the respective WDM switched signal to be fed to the connection verification unit 104.

In the connection verification unit 104, the tapped WDM input signal received from each tap splitter 110X is fed to a respective optical demultiplexer 112X (only one of which is shown). Each demultiplexer can be of standard design and, as such, the optical signal emerging at each output of the demultiplexer associated with a particular input optical fiber is a distinct one of the plurality of single-wavelength optical signals travelling on that fiber, although at a lower intensity due to the presence of the corresponding splitter.

Considering the demultiplexer 112X, each of its outputs is connected to a respective one of a plurality of photodiodes 114X (only one of which is shown). Each photodiode 114X is arranged to convert incoming photons into an electrical potential at its output and could be a PIN diode, for example. The output of the photodiode 114X will be a wideband analog voltage signal representing a digital optical signal with a clock rate (already denoted $F_C$). However, the connection verification unit 104 may operate in a frequency range limited by several tens of MHz. To avoid aliasing problems during sampling, a suitable anti-alias filter 116X is connected to the output of the photodiode 114X. The signal at the output of the anti-alias filter 116X, denoted X(t), is supplied to a correlation unit 120.

Also connected to the output of the photodiode 114X is an averaging unit 118X. The averaging unit 118X estimates the mean level (i.e., the DC voltage) of the signal at the output of the photodiode 114X. Since the mean level of the voltage signal at the output of the photodiode 114X is directly related to the mean optical intensity impinging on the photodiode 114X, the output of the averaging unit 118X is in fact an estimate of the optical intensity of the corresponding single-wavelength signal being admitted by the demultiplexer 112X. The mean intensity estimate produced by the averaging unit 118X, denoted $A_X$, is supplied to the correlation unit 120 and to a controller 130. If $A_X$ is provided in digital form, the connection between the averaging unit 118X, the correlation unit 120 and the controller 130 could be established via a data bus.

Having described an input signal "arm" of the connection verification unit 104 for a particular output of a particular demultiplexer 112X, an analogous structure is provided in a corresponding switched signal "arm". Specifically, each tapped WDM switched signal is fed to a respective one of a plurality of optical demultiplexers 112Y (only one of which is shown). Each output of the demultiplexer 112Y is connected to a respective one of a plurality of photodiodes 114Y (only one of which is shown). The photodiode 114Y is connected to an anti-alias filter 116Y having a suitable bandwidth. As with the anti-alias filter 116X, the signal at the output of the anti-alias filter 116Y, denoted Y(t), is supplied to the correlation unit 120. An averaging unit 118Y also receives the voltage signal at the output of the photodiode 114Y. The mean intensity estimate produced by the averaging unit 118Y, denoted $A_Y$, is supplied both to the correlation unit 120 and to the controller 130.

The inputs of the correlation unit 120 therefore include the mean intensity estimates $A_X$ and $A_Y$ supplied by the averaging units 118X and 118Y, as well as the low-pass filtered analog signals X(t) and Y(t) supplied by the anti-alias filters 116X and 116Y. The output of the correlation unit 120 at sample time "m" is a correlation value, denoted $R_O^{(m)}$, which is supplied to the controller 130. More details regarding the structure and operation of the correlation unit 120 shall be given later on.

For its part, the controller 130 accepts the correlation value $R_O^{(m)}$ from the correlation unit 120, as well as the mean intensity estimates $A_X$ and $A_Y$ from the averaging units 118X and 118Y. Based on these values, on the coordinates (input optical fiber and wavelength) of the single-wavelength input signal entering the input signal arm, on the coordinates (output optical fiber and wavelength) of the single-wavelength switched signal entering the switched signal arm, and on the connection map being applied by the switching unit 102, the controller 130 makes a decision as to whether the connection involving the two corresponding single-wavelength signals is valid. Access to the connection map may be provided via a fabric control unit (not shown) that is commonly used to control the switching unit 102.

For example, consider the $p^{th}$ wavelength on the $q^{th}$ input optical fiber, and the $p^{th}$ wavelength on the $Q^{th}$ output optical fiber. The connection map will indicate whether a connection is supposed to exist between these two signals. If a connection is indeed supposed to exist, then the ideal value of $R_O^{(m)}$ will be high (close to 1) and if not, the ideal value of $R_O^{(m)}$ will be low (close to 0). By comparing the value of $R_O^{(m)}$ received from the correlation unit 120, the controller 130 can decide to what degree the computed value of $R_O^{(m)}$ matches its ideal value. If there is a match, then the switching unit 102 is deemed to be functioning properly for this particular combination of fibers and wavelengths. Conversely, if there is no match, then the switching unit 102 is deemed to have malfunctioned for this particular combination.

Figure 2:
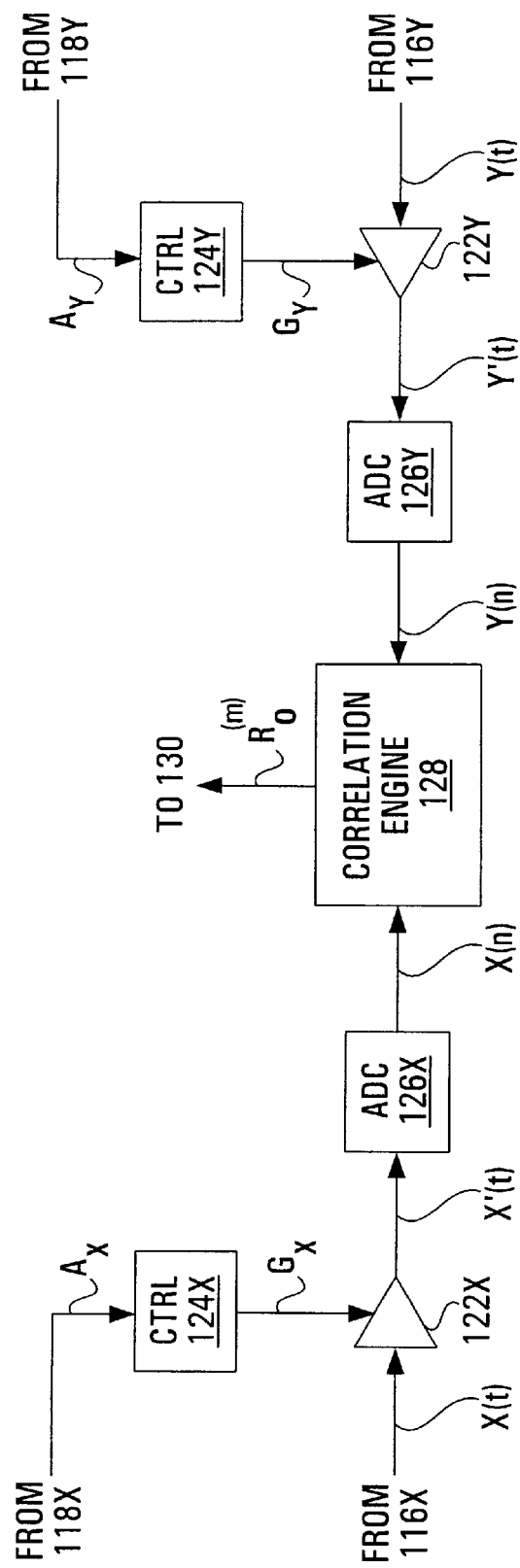
FIG. 2 is a block diagram of the functional elements within a correlation unit in the switching element of FIG. 1.

The correlation unit 120 is now described in greater detail with additional reference to FIG. 2. Specifically, along an input signal path, there is provided a programmable-gain amplifier 122X, which accepts the low-pass filtered analog input signal X(t) from the anti-alias filter 116X. The programmable-gain amplifier 122X has a gain, denoted $G_X$, which is controllable by a gain control functional element 124X. The gain $G_X$ of the programmable-gain amplifier 122X can be defined as the ratio of the level of the amplified analog signal (denoted X' (t)) to the level of the low-pass filtered analog input signal X(t).

Based on the mean intensity estimate $A_X$ output by the averaging unit 118X, the gain control functional element 124X computes the gain $G_X$ to be applied by the programmable-gain amplifier 122X. For reasons that will be explained later on in connection with FIGS. 3A and 3B, computation of $G_X$ need not rely on information about the amplified analog signal X' (t), which affords a considerable simplification of the gain control loop as compared to traditional level setting approaches.

The amplified analog signal X' (t) is sampled and quantized by an analog-to-digital converter (ADC) 126X. The ADC 126X limits the amplitude of X' (t) to an input range that is bound by a minimum input level and a maximum input level. The output of the ADC 126X is a digital sample stream, denoted X(n), which is fed to a first input of a digital correlation engine 128.

Similarly, in a switched signal "arm" of the correlation unit 120, there is provided a programmable-gain amplifier 122Y, which accepts the low-pass filtered analog switched signal Y(t) from the anti-alias filter 116Y. The programmable-gain amplifier 122Y has a gain, denoted $G_Y$, which is controllable by a gain control functional element 124Y. The gain control functional element 124Y is arranged (e.g., programmed) to compute the gain $G_Y$ to be applied by the programmable-gain amplifier 122Y, as a function of the mean intensity estimate $A_Y$ supplied by the averaging unit 118Y. The amplified analog signal, denoted Y' (t), is sampled and quantized by an ADC 126Y, whose output sample stream, denoted Y(n), is fed to a second input of the correlation engine 128.

The characteristics of sample-and-hold circuits within the ADCs 126X, 126Y should be chosen to as to ensure compatibility with the bandwidth of the anti-alias filters 116X, 116Y (or vice-versa). In correlating the two signals (i.e., the input signal and the switched signal), aliasing in itself does not present a problem; indeed, the folding of spectral information at a frequency higher than half the sampling rate can be beneficial as it provides even more information to the correlation. However, if the passband of the anti-alias filters 116X, 116Y is too high, the sample-and-hold circuits will not be synchronized between the two correlation "arms" and the data may appear to be less correlated. Thus, in general, the bandwidth of the anti-alias filters 116X, 116Y could be chosen such that it has a time constant that is somewhat greater than the temporal uncertainty of the sample-and-hold circuits.

The correlation engine 128 computes a function of the two sample streams X(n) and Y(n) in order to produce a correlation value, denoted $R_O^{(m)}$, for the present sample time m. In one embodiment of the present invention, the correlation value can be computed in a computationally efficient manner, for example:

$$R_O^{(m)} = \Sigma(X(m-j) \cdot Y(m-j))/\Sigma|X(m-j) \cdot Y(m-j)|, \quad 0 \leq j \leq N, \tag{1}$$

for some finite value of N. Of course, it is also within the scope to use other functions, some of which are less computationally efficient, for example:

$$R_O^{(m)} = \frac{\sum (X(m-j) \cdot Y(m-j))}{sqrt(\sum X^2(m-j) \cdot \sum Y^2(m-j))}, \quad 0 \leq j \leq N. \tag{2}$$

Still other correlation functions will be known to those skilled in the art and any of these is suitable for use with the present invention.

The correlation value $R_O^{(m)}$ for the current value of m is output by the correlation engine 128 to the controller 130. Because the correlation function being performed is digital in nature, the correlation engine 128 could be implemented in a micro-controller or digital signal processor.

Since the controller's decisions as to whether or not a connection is valid are based on the correlation value $R_O^{(m)}$, it is important to provide a reliable value of $R_O^{(m)}$ to the controller 130. It turns out that reliability of $R_O^{(m)}$ is dependent on the amount of "clipping" that the amplified analog signals X' (t), Y' (t) undergo as they are sampled and quantized by the ADCs 126X, 126Y. The amount of clipping performed by the ADCs 126X, 126Y is, in turn, dependent upon the gains $G_X$, $G_Y$ of the programmable-gain amplifiers 122X, 122Y. It is therefore important to understand the effect of the gains $G_X$, $G_Y$ of the two programmable-gain amplifiers 122X, 122Y on the reliability of the resulting correlation value $R_O^{(m)}$.

To this end, it is helpful to begin by analyzing the properties of the voltage signal at the output of the photodiode 114X. (An analogous analysis applies to the single-wavelength switched signal entering the photodiode.) It is recalled that the signal at the output of the photodiode 114X is a wideband analog voltage signal representative of a digital optical signal having a clock rate $F_C$. For a truly random pattern of zeroes and ones in the digital optical signal, the power spectrum of the voltage signal at the output of the photodiode 114X denoted S(f), will obey approximately the following relationship (see Horowitz and Hill, The Art of Electronics, Cambridge University Press, ISBN 0 521 23151 5, p.441):

$$S(f) = ((\sin (\pi f/F_C))/(\pi f/F_C))^2. \tag{3}$$

It can be easily seen that for $f \ll /F_C$, $S(f)$ is approximately equal to one. Therefore, after low-pass filtering at a bandwidth of $F_B$ hertz where $F_B \ll /F_C$, the resultant power spectrum will be substantially flat.

It can further be shown (again see Horowitz and Hill, The Art of Electronics, Cambridge University Press, ISBN 0 521 23151 5, p.441) that the voltage level of the low-pass filtered analog input signal $X(t)$ is no longer limited to between zero and a maximum voltage but instead has a Gaussian probability density function (pdf) with zero mean. By virtue of the low-pass filtered analog input signal $X(t)$ having a Gaussian pdf, it becomes a simple matter to compute the probability that $X(t)$ will exceed a given voltage $V_{MAX}$. Specifically, this probability is given by the value of the complementary error function "erfc" evaluated at $V_{MAX}/\sigma x^2$, where $\sigma x^2$ is the variance of the $X(t)$ and where $erfc(a)$ can be defined as:

$$(2 \text{ pi})^{-\frac{1}{2}} \int_a^\infty \left(e^{-\frac{1}{2}t^2}\right) dt. \quad (4)$$

(The above definition was take from Helstrom, Carl W., *Probability and Stochastic Processes for Engineers*, 2nd edition, New York, Macmillan Publishing Company, 1991. It is to be appreciated that different texts may use slightly different definitions for the complementary error function.)

Next, it is noted that the standard deviation $\sigma_X$ of $X(t)$ is in fact the root-mean-square (RMS) value of $X(t)$ since the latter is a zero-mean random process. It follows that the low-pass filtered analog input signal $X(t)$ will exceed $V_{MAX}$ during a percentage of the time equal to:

$$100 \cdot erfc(V_{MAX}/\sigma_X) = 100 \cdot erfc(V_{MAX}/V_{RMS,X}). \quad (5)$$

Applying a gain of $G_X$ at the amplifier 122X and setting the maximum input level of the ADC to $V_{MAX}$, it is seen that control of $G_X$ directly provides control over the percentage of the time during which the amplified signal $X'(t)$ is clipped by the ADC. Specifically, this percentage of time may be denoted by $P_{CLIP}$ and is equal to:

$$P_{CLIP} = 100 \cdot erfc(G_X V_{MAX}/V_{RMS,X}). \quad (6)$$

The effects of controlled clipping (i.e., setting $G_X$ and $G_Y$ to achieve a desired percentage of clipped samples in the input signal arm and the switched signal arm of the connection verification unit 104) on the value of $R_O^{(m)}$ computed by the correlation engine 128 are now discussed with reference to FIGS. 3A and 3B.

Figure 3A:
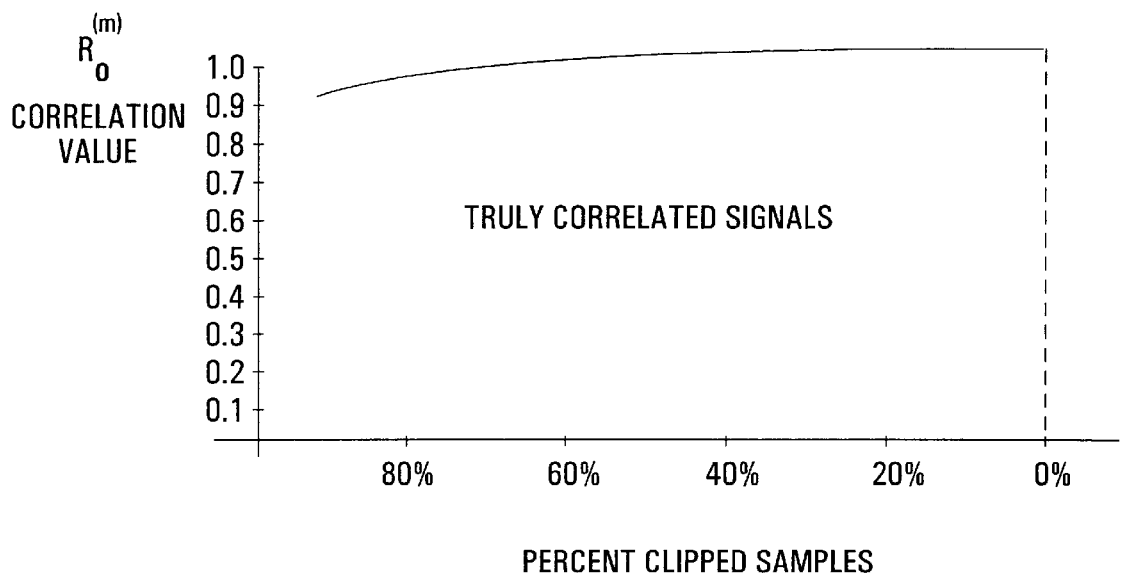
FIG. 3A shows the effect of controlled clipping of two signals on the correlation result obtained when the two signals are correlated.

Specifically, with reference to FIG. 3A, simulations were performed having regard to two truly correlated signals, i.e., the ideal value of $R_O^{(m)}$ was unity. The signals were clipped to varying degrees and the value of $R_O^{(m)}$ using equation (1) above was plotted as a function of the percentage of samples that had undergone clipping. The curve shows that $R_O^{(m)}$ remains to within 10% of its ideal value of unity, even as the percentage of clipped samples approaches 90%. This shows that reliability of the correlation value $R_O^{(m)}$ is virtually unaffected by mild or even severe clipping, when the input and switched signals are truly correlated.

Figure 3B:
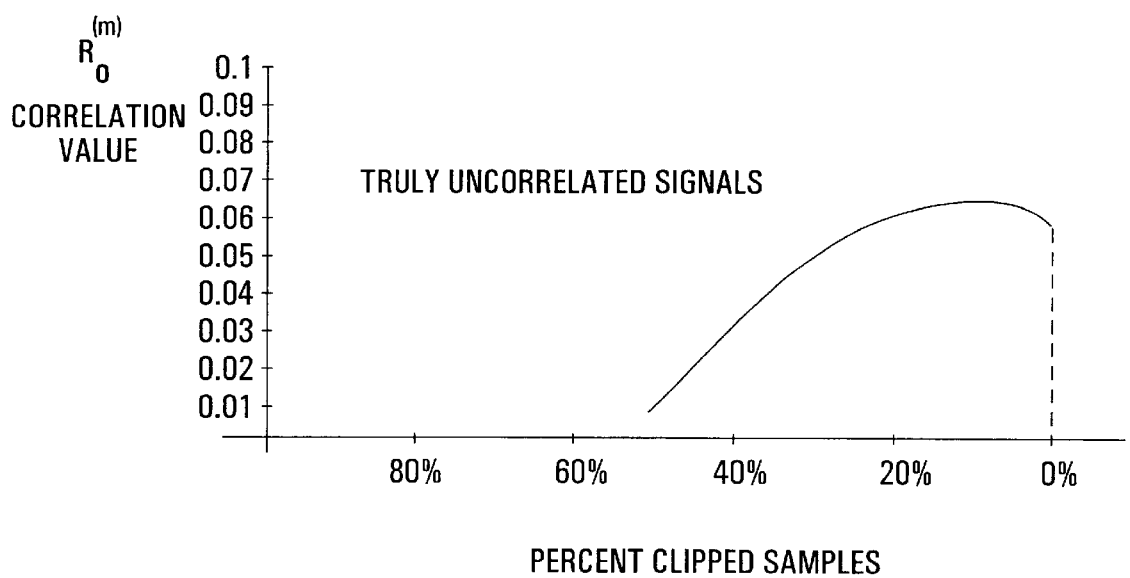
FIG. 3B shows the effect of controlled clipping of two signals on the correlation result obtained when the two signals are uncorrelated.

With reference now to FIG. 3B, a similar simulation was performed, but with two truly uncorrelated signals, i.e., the ideal value of $R_O^{(m)}$ was zero. Again, the signals were clipped to varying degrees and the value of $R_O^{(m)}$ using equation (1) above was plotted as a function of the percentage of samples that had undergone clipping. In this case, the curve shows that $R_O^{(m)}$ actually decreases as the percentage of samples which undergo clipping is increased. This effect occurs even when the gain is so high that 50% of the samples are being clipped. The implication is that clipping causes the computed correlation value $R_O^{(m)}$ to be more reliable, since it is closer to its ideal value.

In view of the above results, it should be apparent to one of ordinary skill in that art that introducing a certain amount of clipping improves reliability of the correlation value $R_O^{(m)}$. The beneficial effects of clipping start at a very low percentage of clipped samples and continue as clipping reaches 10% of the samples or even 50% or higher.

To achieve a desired percentage of clipping and, one may exert control over the gains $G_X$, $G_Y$ of the amplifiers 122X, 122Y. Specifically, to achieve a desired percentage $P_{CLIP}$ of samples clipped at the ADC, the gain $G_X$ to be applied by the amplifier 122X can be derived from equation (6) above to be the following:

$$G_X = (V_{RMS,X}/V_{MAX}) \cdot erfc^{-1}(P_{CLIP}/100). \quad (7)$$

An analogous analysis applies to computation of the desired gain $G_Y$ for amplifier 122Y, resulting in the following expression:

$$G_Y = (V_{RMS,Y}/V_{MAX}) \cdot erfc^{-1}(P_{CLIP}/100). \quad (8)$$

Now, assuming the duty cycle of the single-wavelength input signal to be approximately 50% (that is to say, the laser spends—on average—as much time "on" as it does "off"), it can be shown that $V_{RMS,X}$ is given by (see Horowitz and Hill, The Art of Electronics, Cambridge University Press, ISBN 0 521 23151 5, p.441):

$$V_{RMS,X} = A_X \cdot sqrt(2 \ F_B/F_C). \quad (9)$$

Therefore, it should be apparent that equation (7) for $G_X$ involves only the parameters $A_X$, $F_B$, $F_C$ and $P_{CLIP}$. The only dynamically changing parameter is $A_X$, which is obtained from the averaging unit 118X without reliance on the amplified analog signal $X'(t)$. Similarly, the only time-varying parameter used in equation (8) for $G_Y$ is $A_Y$, which is conveniently supplied by the averaging unit 118Y. This results in a level setting technique which not only provides the above-mentioned advantages related to reliability of the correlation value $R_O^{(m)}$ arising from controlled clipping of the low-pass filtered analog signals $X(t)$, $Y(t)$, but which is also stable and robust because the parameters it requires are computed without reliance on feedback techniques.

Of course, various modifications of the invention are possible. For example, it is within the scope of the invention to replace the plurality of demultiplexers 112X in the input signal arm with a single-output wavelength selection device. The wavelength selection device could be designed to controllably pass the optical signal occupying a single selected wavelength from a single selected one of the input optical fibers 104. A suitable example of a wavelength selection device has been described as a "front end" in U.S. patent application Ser. #60/207,292 to Graves et al., entitled "Optical Switch with Connection Verification", filed on May 30, 2000, assigned to the assignee of the present invention and incorporated by reference herein. Control of the wavelength selection device could be achieved from the controller 130, which would also have access to the connection map of the switching unit 102. An analogous arrangement could be provided at the switched signal "arm" of the connection verification unit 104. In this way, connection verification could be achieved on a sequential basis, thus reducing the processing requirements. However, it would take much longer to verify all the connections through the switching unit 102.

Furthermore, it is to be appreciated that the improvements in the reliability of the correlation value $R_O^{(m)}$ resulting from controlled clipping extends to situations in which the signals are already in digital form prior to clipping. In this case, the amplitude-limiting function would not be performed by an analog-to-digital converter but instead could be performed in software.

In some embodiments, it may be advantageous to use a high-pass filter in addition to each of the low-pass anti-alias filters 116X, 116Y. The roll-off frequency of the high-pass filters should be roughly equal to the sampling rate divided by N, the number of samples in the correlation vector. The high pass filter prevents loss of dynamic range due to large swings of the entire data stream in the correlation vector. If the correlation vector is sufficiently large (e.g., 50 samples) then the effects of this additional filter on the gain calculation (see equations (7) and (8) above) are negligible.

Other embodiments of the invention could include a plurality of connection verification units 104 sharing a common controller. Thus, the common controller could receive multiple correlation values $R_{O,1}^{(m)}$, $R_{O,2}^{(m)}$, . . . $R_{O,P}^{(m)}$ from multiple correlation engines. The controller could then make a decision as to the true value of $R_O^{(m)}$ by evaluating a function (e.g., the product, mean, median or mode) of the multiplicity of correlation values.

Those skilled in the art should also appreciate that in some embodiments of the invention, all or part of the functionality previously described herein with respect to the gain control functional elements 124X, 124Y and the correlation engine 128 may be implemented as pre-programmed hardware or firmware elements (e.g., application specific integrated circuits (ASICs), electrically erasable programmable read-only memories (EEPROMs), etc.), or other related components. In other embodiments of the invention, all or part of the functionality previously described herein with respect to the gain control functional elements 124X, 124Y and the correlation engine 128 may be implemented as software consisting of a series of instructions for execution by a computer system.

The series of instructions could be stored on a medium which is fixed, tangible and readable directly by the computer system, (e.g., removable diskette, CD-ROM, ROM, or fixed disk), or the instructions could be stored remotely but transmittable to the computer system via a modem or other interface device (e.g., a communications adapter) connected to a network over a transmission medium. The transmission medium may be either a tangible medium (e.g., optical or analog communications lines) or a medium implemented using wireless techniques (e.g., microwave, infrared or other transmission schemes).

Those skilled in the art should further appreciate that the series of instructions may be written in a number of programming languages for use with many computer architectures or operating systems. For example, some embodiments may be implemented in a procedural programming language (e.g., "C") or an object oriented programming language (e.g., "C++" or "JAVA").

While specific embodiments of the present invention have been described and illustrated, it will be apparent to those skilled in the art that numerous modifications and variations can be made without departing from the scope of the invention as defined in the appended claims.

I claim:

1. A method of setting the level of an analog signal supplied to an electronic device having a maximum input level, comprising:

computing a gain which, when applied to the analog signal, causes the resulting amplified signal to exceed the maximum input level for a percentage of time which is greater than zero; and applying said gain to the analog signal.

2. A method as claimed in claim 1, wherein said gain is related by a proportionality constant to the quotient of the maximum input level and the root-mean-square level of the analog signal.

3. A method as claimed in claim 2, wherein the proportionality constant is $1/\beta$, where $\beta$ is selected such that the value of the complementary error function at $\beta$ is substantially equal to said percentage of time.

4. A method as claimed in claim 1, wherein the analog signal is a low-pass filtered version of a wideband signal representing a bit stream having a bit rate, the method further comprising:

obtaining a mean level of the wideband signal;

wherein said gain is selected to be a function of the maximum input level, the bandwidth of the analog signal, the bit rate of the bit stream and the mean level of the wideband signal.

5. A method as claimed in claim 4, wherein said gain is related by a proportionality constant to the quotient of $(V_{MAX} \cdot V_{AVG} \cdot (2 F_B)^{1/2})$ and $(F_C)^{1/2}$, where $V_{AVG}$ denotes the mean level of the wideband signal, $F_C$ denoted the bit rate of the bit stream, $F_B$ denotes the bandwidth of the analog signal and $V_{MAX}$ denotes the maximum input level.

6. A method as claimed in claim 5, wherein the proportionality constant is $1/\beta$, where $\beta$ is selected such that the value of the complementary error function at $\beta$ is substantially equal to said percentage of time.

7. A method as claimed in claim 1, further comprising:

obtaining said analog signal by low-pass filtering a wideband signal representing a bit stream having a bit rate;

obtaining a mean level of the wideband signal;

wherein said gain is selected to be a function of the maximum input level, the bandwidth of the analog signal, the bit rate of the bit stream and the mean level of the wideband signal.

8. A method as claimed in claim 1, wherein said gain is computed exclusively using feedforward techniques.

9. A method as claimed in claim 1, wherein said gain is computed without feedback from the amplified signal.

10. A method as claimed in claim 1, wherein said percentage of time is predetermined.

11. In combination:

an electronic device having an input terminal and characterized by a maximum input level; and an amplifier connected to the input terminal of the electronic device, for applying a gain to an analog input signal, said gain being selected such that the average percentage of time during which the signal supplied to the electronic device exceeds said maximum input level is greater than zero.

12. The combination of claim 11, wherein the electronic device is an analog-to-digital converter.

13. The combination of claim 11, further comprising:

a control element connected to the amplifier, for setting said gain.

14. The combination of claim 13, wherein the control element is adapted to set the gain substantially equal to $1/\beta$ times the quotient of the maximum input level and the root-mean-square level of the analog input signal.

15. The combination of claim 14, wherein $\beta$ is selected such that the value of the complementary error function at $\beta$ is substantially equal to said percentage of time.

16. The combination of claim 13, wherein the analog signal is a low-pass filtered version of a wideband signal representing a bit stream having a bit rate, wherein the control element is adapted to obtain a mean level of the wideband signal and to set the gain as a function of the maximum input level, the bandwidth of the analog signal, the bit rate of the bit stream and the mean level of the wideband signal.

17. The combination of claim 16, wherein the mean level of the wideband signal is denoted $V_{AVG}$, wherein the bit stream has a bit rate denoted $F_C$, wherein the analog signal has a bandwidth denoted $F_B$, wherein the maximum input level is denoted $V_{MAX}$ and wherein the controller is adapted to set the gain substantially equal to $1/\beta$ times the quotient of $(V_{MAX} \cdot V_{AVG} \cdot (2 F_B)^{1/2})$ and $(F_C)^{1/2}$.

18. The combination of claim 17, wherein $\beta$ is selected such that the value of the complementary error function at $\beta$ is substantially equal to said percentage of time.

19. The combination of claim 18, wherein said percentage of time is predetermined.

20. The combination of claim 13, further comprising:

a filter connected to an input of the amplifier, for producing the analog signal by filtering a wideband signal representing a bit stream having a bit rate;

wherein the control element is adapted to receive a mean level of the wideband signal and to set the gain as a function of the maximum input level, the bandwidth of the analog signal, the bit rate of the bit stream and the mean level of the wideband signal.

21. The combination of claim 20, further comprising:

an averaging unit connected to an input of the control element, for determining said mean level of the wideband signal.

* * * * *